(12) United States Patent
Curry et al.

(10) Patent No.: US 11,688,621 B2
(45) Date of Patent: Jun. 27, 2023

(54) BATCH PROCESSING OVEN AND OPERATING METHODS

(71) Applicant: Yield Engineering Systems, Inc., Fremont, CA (US)

(72) Inventors: Mark William Curry, Morgan Hill, CA (US); Ronald R. Stevens, Pleasanton, CA (US); Craig W. McCoy, San Jose, CA (US); Charudatta Galande, Fremont, CA (US); Gabriel Ormonde, Lathrop, CA (US)

(73) Assignee: YIELD ENGINEERING SYSTEMS, INC., Fremont, CA (US)

( * ) Notice: Subject to any disclaimer, the term of this patent is extended or adjusted under 35 U.S.C. 154(b) by 195 days.

(21) Appl. No.: 17/218,697

(22) Filed: Mar. 31, 2021

(65) Prior Publication Data
US 2022/0189809 A1    Jun. 16, 2022

Related U.S. Application Data

(60) Provisional application No. 63/123,604, filed on Dec. 10, 2020.

(51) Int. Cl.
*H01L 21/677* (2006.01)
*F27B 17/00* (2006.01)

(52) U.S. Cl.
CPC .... *H01L 21/67781* (2013.01); *F27B 17/0025* (2013.01); *H01L 21/67754* (2013.01); *H01L 21/67757* (2013.01)

(58) Field of Classification Search
None
See application file for complete search history.

(56) References Cited

U.S. PATENT DOCUMENTS

| | | |
|---|---|---|
| 1,991,331 A | 2/1935 | Morton |
| 3,302,939 A | 2/1967 | Scharbrough |
| 4,597,736 A | 7/1986 | Moffat |
| 5,320,680 A | 6/1994 | Learn |

(Continued)

FOREIGN PATENT DOCUMENTS

| | | | | |
|---|---|---|---|---|
| TW | 108105189 | 10/2019 | | |
| TW | 202044352 A | * 12/2020 | ......... | C23C 16/4412 |

(Continued)

OTHER PUBLICATIONS

TW-202044352-A English Translation (Year: 2020).*

(Continued)

*Primary Examiner* — Michael G Hoang
*Assistant Examiner* — Kurt J Wolford
(74) *Attorney, Agent, or Firm* — Finnegan, Henderson, Farabow, Garrett & Dunner, LLP

(57) ABSTRACT

A batch processing oven comprising a processing chamber and a rack configured to be positioned in the processing chamber. The rack is configured to support a plurality of substrates and a plurality of panels in a stacked manner such that one or more substrates of the plurality of substrates are positioned between at least one pair of adjacent panels of the plurality panels. Vertical gaps separate each substrate of the one or more substrates from an adjacent substrate or panel on either side of the substrate.

17 Claims, 10 Drawing Sheets

(56) References Cited

U.S. PATENT DOCUMENTS

| | | |
|---|---|---|
| 5,478,397 A | 12/1995 | Shibata |
| 5,516,283 A | 5/1996 | Schrems |
| 5,525,780 A | 6/1996 | Moslehi |
| 5,662,470 A | 9/1997 | Huussen et al. |
| 5,763,856 A | 6/1998 | Ohkase |
| 6,005,225 A | 12/1999 | Kowalski |
| 6,059,567 A | 5/2000 | Bolton |
| 6,198,075 B1 | 3/2001 | Moffat |
| 6,225,602 B1 | 5/2001 | Buijze et al. |
| 6,369,361 B2 | 4/2002 | Saito |
| 6,780,225 B2 | 8/2004 | Shaw et al. |
| 8,361,548 B2 | 1/2013 | Moffat et al. |
| 9,028,614 B2 | 5/2015 | Hara |
| 9,222,732 B2 | 12/2015 | Shirako |
| 10,147,616 B2 | 12/2018 | Moffat et al. |
| 10,490,431 B2 | 11/2019 | Moffat et al. |
| 11,335,662 B2 | 5/2022 | Karim et al. |
| 11,444,053 B2 | 9/2022 | Karim et al. |
| 2002/0102353 A1 | 8/2002 | Mauthner |
| 2002/0182870 A1 | 12/2002 | Matsunaga |
| 2003/0094451 A1 | 5/2003 | Hamaguchi |
| 2003/0183614 A1 | 10/2003 | Yamaguchi |
| 2005/0183820 A1 | 8/2005 | Fukuda |
| 2007/0167026 A1 | 7/2007 | Miura |
| 2008/0023141 A1 | 1/2008 | Shimizu et al. |
| 2009/0145890 A1 | 6/2009 | Matsuura et al. |
| 2009/0305512 A1* | 12/2009 | Matsuura .......... H01L 21/67303 118/724 |
| 2012/0000425 A1 | 1/2012 | Park et al. |
| 2012/0067521 A1 | 3/2012 | Shimomura et al. |
| 2012/0223066 A1* | 9/2012 | Yoshii ............... H01L 21/67248 219/390 |
| 2014/0134332 A1* | 5/2014 | Sugino ............. H01L 21/67303 427/248.1 |
| 2018/0211854 A1* | 7/2018 | Hillman .............. H01L 21/6719 |
| 2019/0017169 A1* | 1/2019 | Hanashima ....... H01L 21/67393 |
| 2019/0314738 A1 | 10/2019 | Moffat et al. |
| 2020/0013591 A1 | 1/2020 | Moffat et al. |
| 2020/0048768 A1* | 2/2020 | Wiegers ........... C23C 16/45578 |

FOREIGN PATENT DOCUMENTS

| | | |
|---|---|---|
| WO | WO 2019/099401 | 5/2019 |
| WO | WO 2019/161109 | 8/2019 |

OTHER PUBLICATIONS

International Search Report and Written Opinion of corresponding application PCT/US2021/017634 issued by the European Patent Office (17 pages).

* cited by examiner

BATCH PROCESSING OVEN AND OPERATING METHODS

CROSS-REFERENCE TO RELATED APPLICATIONS

This application claims the benefit of priority from U.S. Provisional Patent Application No. 63/123,604, filed Dec. 10, 2020, which is incorporated herein by reference in its entirety.

TECHNICAL FIELD

The current disclosure relates to batch processing ovens and methods of operating these ovens.

BACKGROUND

A continuing trend in semiconductor technology is the formation of integrated circuit chips having more and faster circuits thereon. Batch processing ovens, furnaces or reactors are commonly used for batch processing semiconductor wafers during many fabrication stages (e.g., oxidation, diffusion, annealing, chemical vapor deposition (CVD), atomic layer deposition (ALD), etc.) of integrated circuits. Currently, the processing chamber of these ovens require significant time to reach the desired operating conditions (temperature, pressure, etc.) without subjecting the substrates in the chamber to undesirable conditions. For example, the heating of thermal mass in the process chamber must be controlled to prevent excessive thermal stress on the substrate being treated, maintain uniform heating of devices on the substrate, completely evaporate curing solvents or polymers used in processing, etc. Too great a temperature difference across a substrate, or from one substrate to another in the oven, can result in damage, uneven cure, irregular polymerization, or other unintended consequences that reduce product yield.

To decrease processing time and increase throughput (resulting in lower processing cost per substrate), it is desirable to increase the heating and cooling ramp rate of the oven. Current batch processing ovens have inherent limitations in their hardware and control systems that hinder increasing temperature ramp rates while maintaining temperature uniformity. Subjecting the thermal mass in the oven at desired ramp rates require changes in the process chamber components, and the way the process chamber is controlled. The embodiments of batch processing ovens and methods disclosed herein may alleviate some of the above-described limitations.

SUMMARY

Several embodiments of a batch processing oven and methods of using the oven are disclosed. It is to be understood that both the foregoing general description and the following detailed description are exemplary and explanatory only. As such, the scope of the disclosure is not limited solely to the disclosed embodiments. Instead, it is intended to cover such alternatives, modifications and equivalents within the spirit and scope of the disclosed embodiments. Persons skilled in the art would understand how various changes, substitutions and alterations can be made to the disclosed embodiments without departing from the spirit and scope of the disclosure.

In one aspect, a batch processing oven is disclosed. The batch processing oven may include a processing chamber and a rack configured to be positioned in the processing chamber. The rack may be configured to support a plurality of substrates and a plurality of panels in a stacked manner such that one or more substrates of the plurality of substrates are positioned between at least one pair of adjacent panels of the plurality of panels. Vertical gaps may separate each substrate of the plurality of substrates from an adjacent substrate or panel on either side of the substrate.

Various embodiments of the disclosed oven may also, additionally or alternatively, include one of more of the following aspects; the oven may further include an inlet dissipater positioned on one side of the processing chamber an exhaust dissipater positioned on an opposite side of the processing chamber, wherein the rack may be configured to be positioned between the inlet and exhaust dissipaters, and wherein the inlet dissipater may be configured to direct a gas into the processing chamber and an exhaust dissipater may be configured to exhaust the gas from the processing chamber; the processing chamber may have a substantially cylindrical shape and the inlet dissipater and the exhaust dissipater may be positioned on diametrically opposite sides of the processing chamber; the inlet dissipater may include multiple inlet tubes extending in a lengthwise direction along an internal wall of the processing chamber, the multiple inlet tubes may be arranged circumferentially to form a partial arc around the internal wall; each inlet tube of the multiple inlet tubes may include a plurality of inlet ports spaced apart from each other in the lengthwise direction; the plurality of inlet ports may be aligned with the vertical gaps that separate each substrate in the rack from an adjacent substrate or panel; the exhaust dissipater may include multiple outlet tubes extending in a lengthwise direction along the internal wall of the processing chamber, the multiple outlet tubes may be arranged circumferentially to form a partial arc around the internal wall, and wherein each outlet tube of the multiple outlet tubes may include a plurality of outlet ports spaced apart from each other in the lengthwise direction.

Various embodiments of the disclosed oven may also, additionally or alternatively, include one of more of the following aspects: the processing chamber may include one or more heaters positioned on an external wall of the processing chamber, and one or more flow baffles positioned on an internal wall of the processing chamber, the one or more flow baffles may be configured to restrict a flow of a gas around a rack positioned in the processing chamber; the rack may include a plurality of thermocouples attached thereto, and the oven may further include a control system configured to control operation of the processing chamber using signals from the plurality of thermocouples as feedback; the processing chamber may have a chamber opening at a bottom side of the processing chamber, and the rack may be configured to be elevated into the processing chamber through the chamber opening; the vertical gaps that separate each substrate of the plurality of substrates from an adjacent substrate or panel may be between 2 mm and 50 mm; at least one panel of the plurality of panels may include embedded heaters.

In another aspect, a method of operating a batch processing oven is disclosed. The method may include positioning a rack in a processing chamber of the oven. The rack may support a plurality of substrates and a plurality of panels in a stacked manner such that one or more substrates of the plurality of substrates are positioned between at least one pair of adjacent panels of the plurality panels. Vertical gaps may separate each substrate of the plurality of substrates from an adjacent substrate or panel on either side of the substrate. The method may also include directing a flow of a hot gas into the processing chamber to heat the plurality of substrates.

Various embodiments of the disclosed method may also, additionally or alternatively, include one of more of the following aspects: wherein (a) the processing chamber may have a substantially cylindrical shape, (b) the processing chamber may include an inlet dissipater and an exhaust dissipater positioned on diametrically opposite sides of the processing chamber and the rack may be positioned between the inlet and exhaust dissipaters, and (c) the inlet dissipater may include a plurality of inlet ports spaced apart in a lengthwise direction and aligned with the vertical gaps that separate each substrate from an adjacent substrate or panel, and wherein directing a flow of a hot gas into the processing chamber may include directing the flow of hot gas through the plurality of inlet ports to flow through the vertical gaps; the processing chamber may include one or more heaters positioned on an external wall of the processing chamber, and the method may further include activating the one or more heaters to heat the plurality of substrates supported in the rack; the rack may include a plurality of thermocouples attached thereto, and wherein directing a flow of a hot gas into the processing chamber may include controlling a temperature or a flow rate of the hot gas directed into the processing chamber using signals from the plurality of thermocouples as feedback; the processing chamber may have a chamber opening at a bottom side of the processing chamber, and positioning a rack in a processing chamber may include elevating the rack into the processing chamber through the chamber opening.

In yet another aspect, a batch processing oven is disclosed. The oven may include a substantially cylindrical processing chamber an inlet dissipater and an exhaust dissipater. The inlet dissipater may include multiple inlet tubes extending in a lengthwise direction along an internal wall of the processing chamber. The multiple inlet tubes may be arranged circumferentially to form a partial arc around the internal wall. Each inlet tube of the multiple inlet tubes may include a plurality of inlet ports spaced apart from each other in the lengthwise direction. The plurality of inlet ports may be configured to direct a hot gas into the processing chamber. The exhaust dissipater may be positioned diametrically opposite the inlet dissipater and may be configured to exhaust the gas from the processing chamber. The oven may also include a rack configured to be positioned in the processing chamber. The rack may be configured to support a plurality of substrates and a plurality of panels in a stacked manner such that one or more substrates of the plurality of substrates are positioned between at least one pair of adjacent panels of the plurality panels. Vertical gaps may separate each substrate of the one or more substrates from an adjacent substrate or panel on either side of the substrate.

Various embodiments of the disclosed method may also, additionally or alternatively, include one of more of the following aspects: the rack may include a plurality of thermocouples attached thereto, and the oven may further include a control system configured to control a flow rate or a temperature of the hot gas directed into the processing chamber using signals from the plurality of thermocouples as feedback; a plurality of heaters coupled to the processing chamber, the control system may be configured to selectively activate one or more heaters of the plurality of heaters based on signals from the plurality of thermocouples; the processing chamber may have a chamber opening at a bottom side of the processing chamber, and the oven may include an elevator lift configured to lift the rack into the processing chamber through the chamber opening.

In another aspect, a batch processing oven is disclosed. The oven may include a processing chamber and a rack configured to be positioned in the processing chamber. The rack may be configured to support a plurality of substrates and a plurality of panels in a stacked manner such that one or more substrates of the plurality of substrates are positioned between at least one pair of adjacent panels of the plurality panels. An inlet dissipater may be positioned on one side of the rack. The inlet dissipater may be configured to direct gas into the processing chamber. The gas may be configured to heat the plurality of substrates in the rack. An outlet dissipater may be positioned on an opposite side of the rack. The exhaust dissipater may be configured to exhaust the gas from the processing chamber. A plurality of thermocouples may be positioned in the processing chamber. The plurality of thermocouple may include a first thermocouple positioned at a first region of the processing chamber, a second thermocouple positioned at a second region of the processing chamber, and a third thermocouple positioned at a third region of the processing chamber. A control system may be configured to receive input from the plurality of thermocouples and control a temperature or a flow rate of the gas directed into the processing chamber through the inlet dissipater.

Various embodiments of the disclosed oven may also, additionally or alternatively, include one of more of the following aspects: a plurality of heaters coupled to the processing chamber, wherein the control system may be further configured to selectively activate one or more heaters of the plurality of heaters based on the input from the plurality of thermocouples; the plurality of heaters may include a first heater positioned at the first region of the processing chamber, a second heater positioned at the second region of the processing chamber, and a third heater positioned at the third region of the processing chamber, wherein the control system may be configured to increase electric power directed to the first heater when the first thermocouple indicates a lower temperature than the second and third thermocouples; the control system may include a PID controller configured to control the temperature or the flow rate of the gas directed into the processing chamber based on input from the plurality of thermocouples.

BRIEF DESCRIPTION OF THE DRAWINGS

The accompanying drawings, which are incorporated in and constitute a part of this disclosure, illustrate exemplary embodiments and, together with the description, are used to explain the disclosed principles. In these drawings, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure of the various described embodiments. Details of well-known components or features may be omitted to avoid obscuring other features, since these omitted features are well-known to those of ordinary skill in the art. Further, elements in the figures are not necessarily drawn to scale. The dimensions of some features may be exaggerated relative to other features to improve understanding of the exemplary embodiments. One skilled in the art would appreciate that the features in the figures are not necessarily drawn to scale and, unless indicated otherwise, should not be viewed as representing proportional relationships between different features in a figure. Additionally, even if it is not specifically mentioned, aspects described with reference to one embodiment or figure may also be applicable to, and may be used with, other embodiments or figures.

DETAILED DESCRIPTION

It should be noted that all relative terms such as "about," "substantially," "approximately," etc. are used to indicate a possible variation of ±10% (unless noted otherwise or another variation is specified). For example, a feature disclosed as being about "t" units long (wide, thick, etc.) may vary in length from 4-0.10 to 4+0.10 units. Similarly, a temperature within a range of about 100-150° C. can be any temperature between (100-10%) and (150+10%). In some cases, the specification also provides context to the relative terms. For example, a structure described as being substantially cylindrical may deviate slightly (e.g., 10% variation in diameter at different locations, etc.) from being perfectly cylindrical.

Unless defined otherwise, all terms of art, notations and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein are incorporated by reference in their entirety. If a definition or description set forth in this disclosure is contrary to, or otherwise inconsistent with, a definition and/or description in these references, the definition and/or description set forth in this disclosure prevails over those in the references that are incorporated by reference. None of the references described or referenced herein is admitted as prior art to the current disclosure.

Figure 1A:
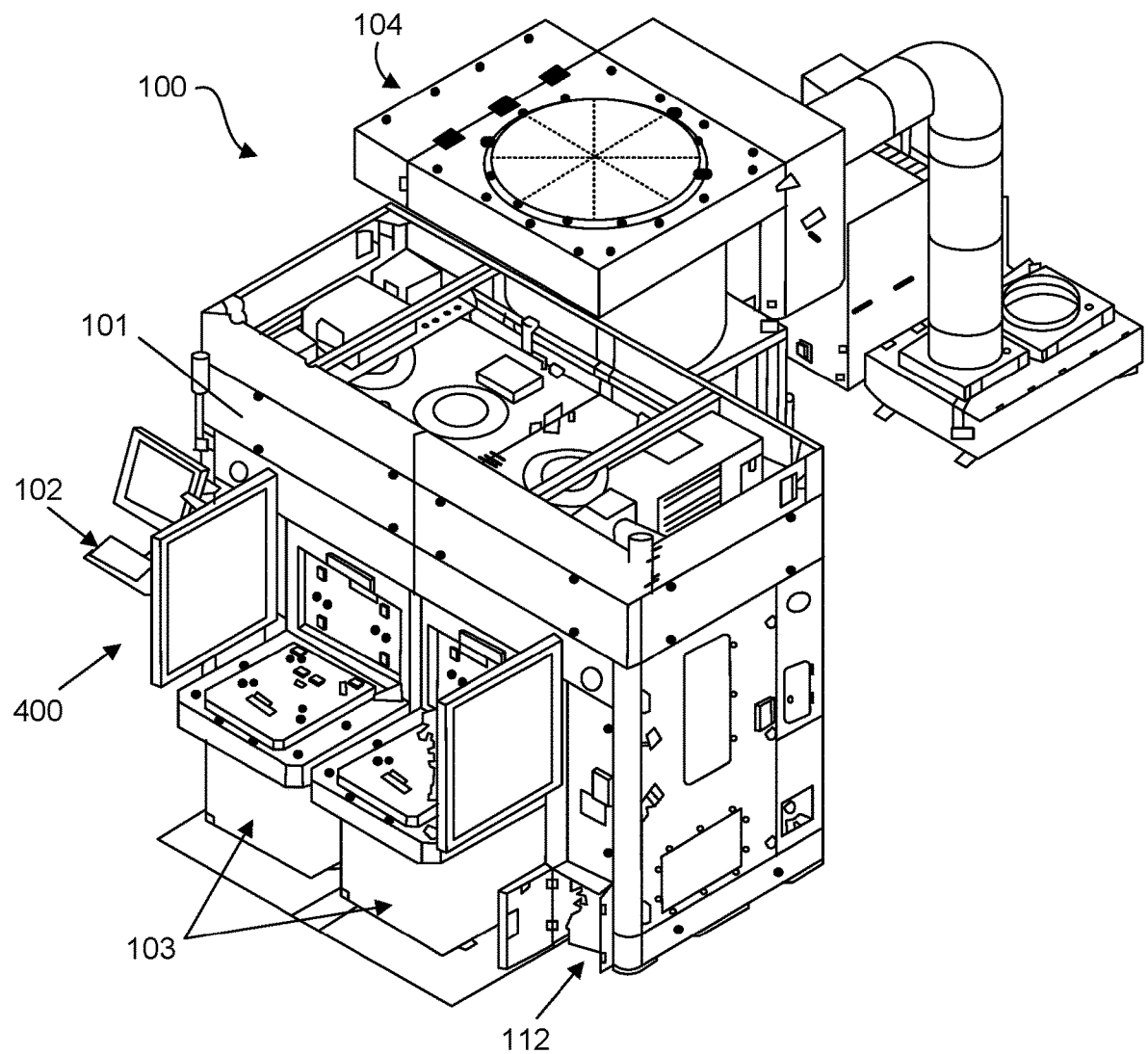
FIGS. 1A and 1B illustrate an exemplary batch processing oven.
Figure 1B:
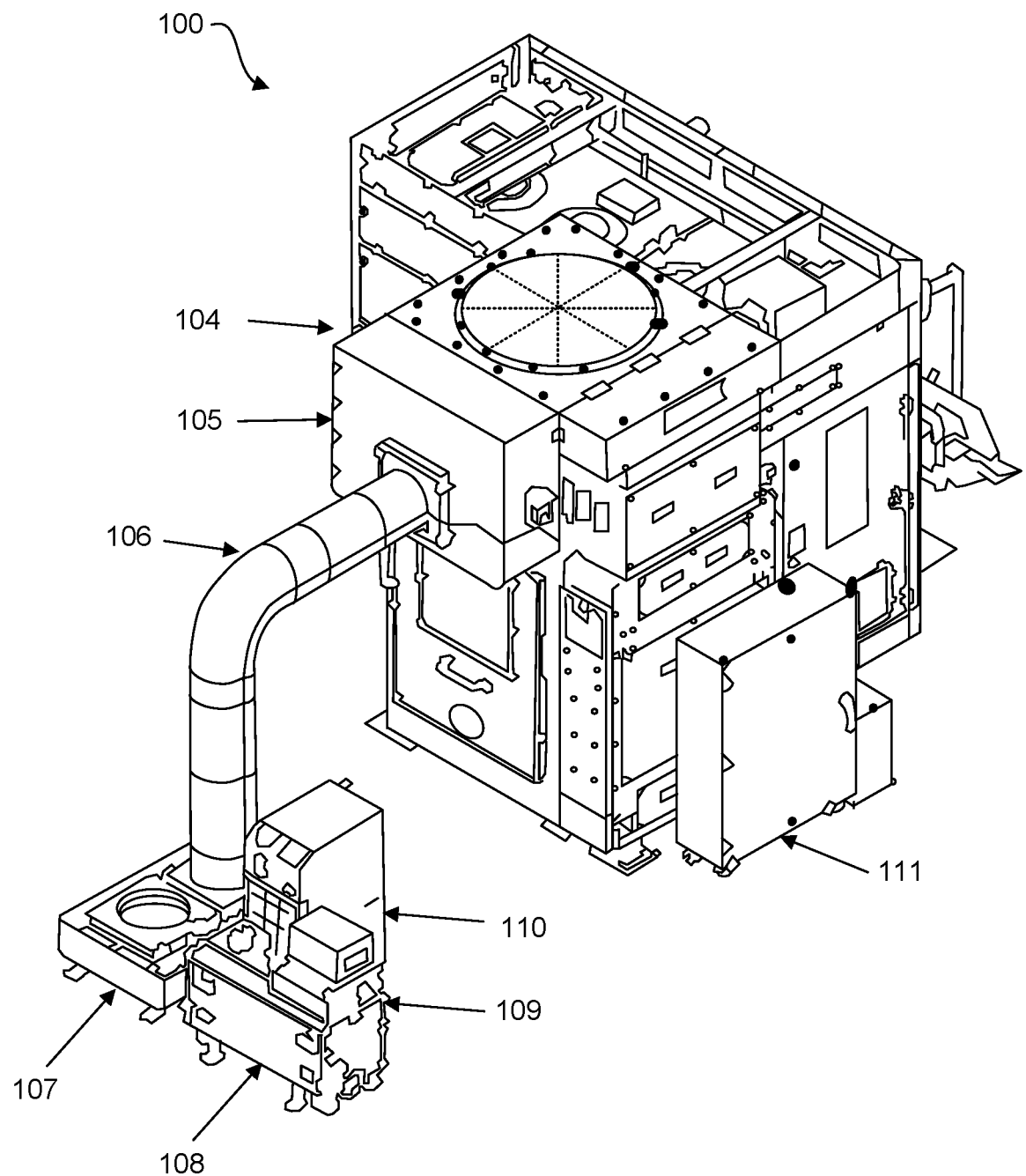

FIGS. 1A and 1B illustrate different views of an exemplary batch processing oven 100 or furnace. An operator works at the GUI 102 (graphic user interface) on an Equipment Front End Module (EFEM 101) where substrates are introduced into the oven 100 via attached load ports 103. Oven 100 includes a process module 104 with a processing chamber assembly (or processing chamber 200) (see FIG. 2). A vacuum pump 108 is connected to processing chamber 200 via a fore line (not shown). A duct interface 105 controls air flow to the process chamber 200 from a duct 106 and a blower 107. An oxygen analyzer 109 connected to the pump exhaust is used to monitor the concentration of oxygen in the processing chamber 200. A chiller 100 supplies cooling water to the pump 108, and a power module 111 supplies electric power to the process chamber 200, EFEM 101, and blower 107. Process gas (e.g., nitrogen) and other gases are directed into oven 100 through facilities panel 112.

Oven 100 includes multiple load ports 103 used to load workpieces (e.g., substrates) that are to be processed into oven 100. In some embodiments, one or more cassettes, or front opening unified pods (FOUPs), containing substrates 202 (see FIG. 2) are placed in load ports 103 which then indexes a door plate between the FOUPs and allows access to a robot inside the EFEM 101 to pick and/or place the substrates 202. The robot picks up a substrate from a FOUP in the load port 103 and transfers the substrate into a rack 201 (see FIGS. 4A and 4B). The desired number of substrates are thus transferred from the FOUPs into rack 201. In some embodiments, the substrates are transferred from the FOUPs into rack 201 until all the available slots in rack 201 are filled or the FOUPs are empty.

Figure 2:
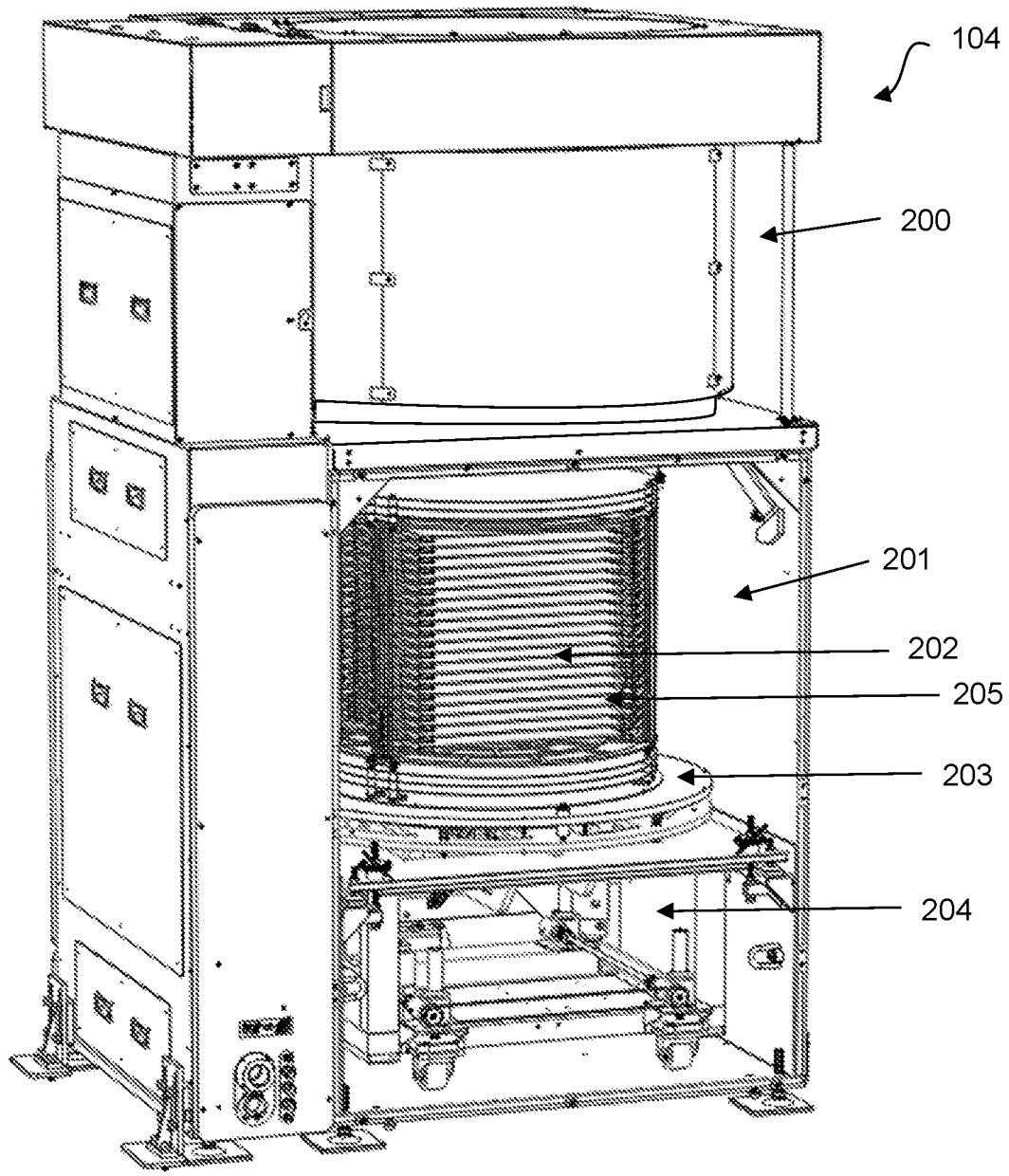
FIG. 2 illustrates an exemplary process module of the oven of FIG. 1A.

FIG. 2 (see also FIG. 3A) illustrates the process module 104 of oven 100. To load the substrates 202 into the process chamber 200 of process module 104, rack 201 loaded with substrates 202 is positioned on a seal plate 203 disposed below process chamber 200. The process chamber 200 includes a load port or a chamber opening at the bottom side of the process chamber 200. The seal plate 203 serves as the door of process chamber 200. After the desired number of substrates 202 have been loaded into rack 201, and the substrates 202 are ready to be processed, an elevator assembly (or lift 204) lifts the seal plate 203 to position the rack 201 with substrates 202 in the process chamber 200. When rack 201 is positioned in process chamber 200, seal plate 203 mates or engages with a flange 323 (see FIG. 3A) around the chamber opening of process chamber 200 to seal the seal plate 203 to process chamber 200.

Figure 3A:
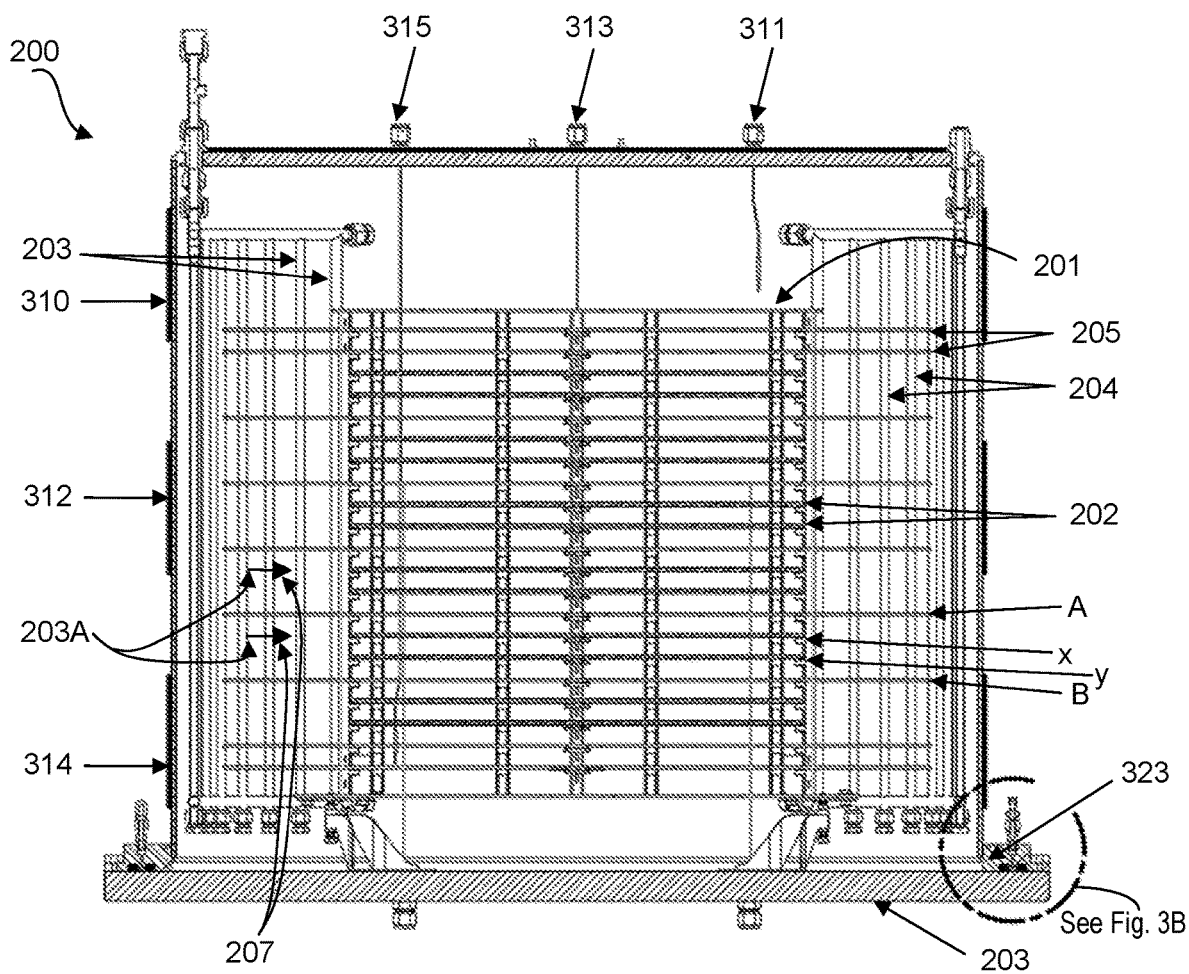
FIGS. 3A-3C illustrates different views of an exemplary processing chamber of the oven of FIG. 1A.
Figure 3B:
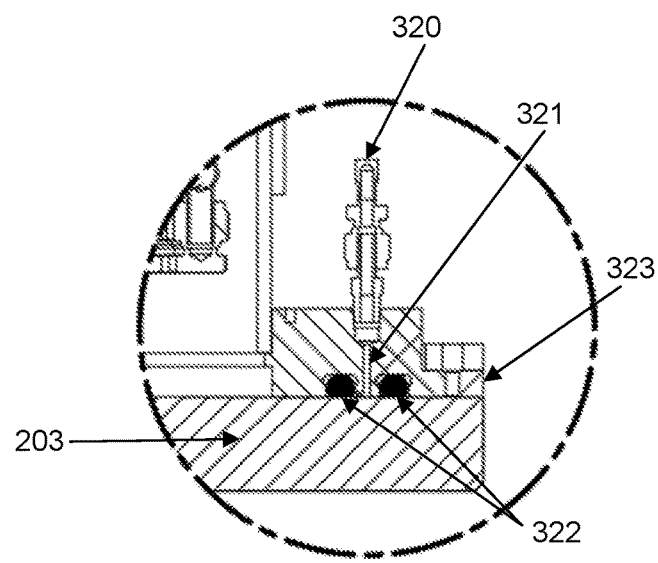
Figure 3C:
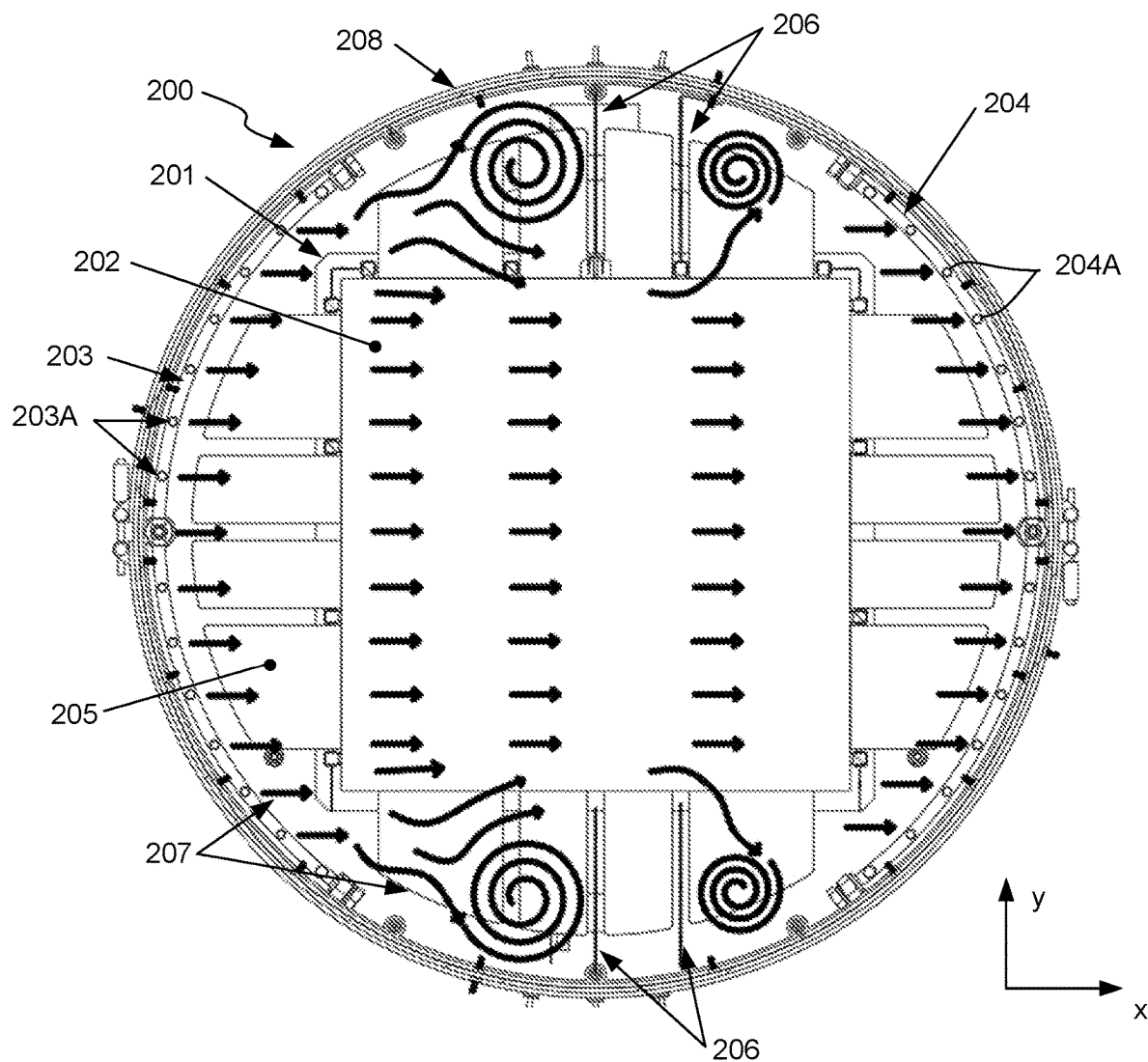

FIG. 3A illustrates a cross-sectional view of process chamber 200 of oven 100 along a vertical plane and FIG. 3C illustrates a cross-sectional view of process chamber 200 along a horizontal plane. As illustrated in these figures, in some embodiments, process chamber 200 may be substantially cylindrical having a substantially circular cross-sectional shape (see FIG. 3C). Rack 201, loaded with substrates 202, is positioned in process chamber 200 with seal plate 203 sealing the volume of process chamber 200 from the outside environment (see FIG. 3A). As best seen in FIG. 3C, rack 201 may be substantially centrally positioned in process chamber 200. In some embodiments, when seal plate 203 engages with flange 323 to seal the process chamber 200, sealing may be achieved by a single O-ring 322 compressing against the flange 323. In some embodiments, two or more O-rings 322 may be positioned between the seal plate 203 and the flange 323 to assist in sealing. FIG. 3B is an enlarged view of seal plate 203 engaging with flange 323 of process chamber 200. In the embodiment illustrated in FIG. 3B, two O-rings 322 are positioned between the seal plate 203 and flange 323. These two O-rings define an annular-ring shaped space between the two O-rings 322. When seal plate 203 engages with flange 323, the two O-rings 322 get compressed. The annular space between the two O-rings 322 may be connected to a purge gas (e.g., nitrogen) source and/or a vacuum pump via a vent conduit 321 and a valve 320. With seal plate 203 engaged with flange 323, the vacuum pump may be used to provide a vacuum in the annular space between the two O-rings 322. Providing a vacuum between the O-rings 322 assists in sealing seal plate 203 against process chamber 200 and minimizing (or preventing) the leakage of oxygen or air into process chamber 200 during processing of substrates 202. U.S. Pat. No. 10,490,431B2, which is incorporated by reference in its entirety herein, describes the sealing of process chamber 200 with seal plate 203 in more detail.

Figure 4A:
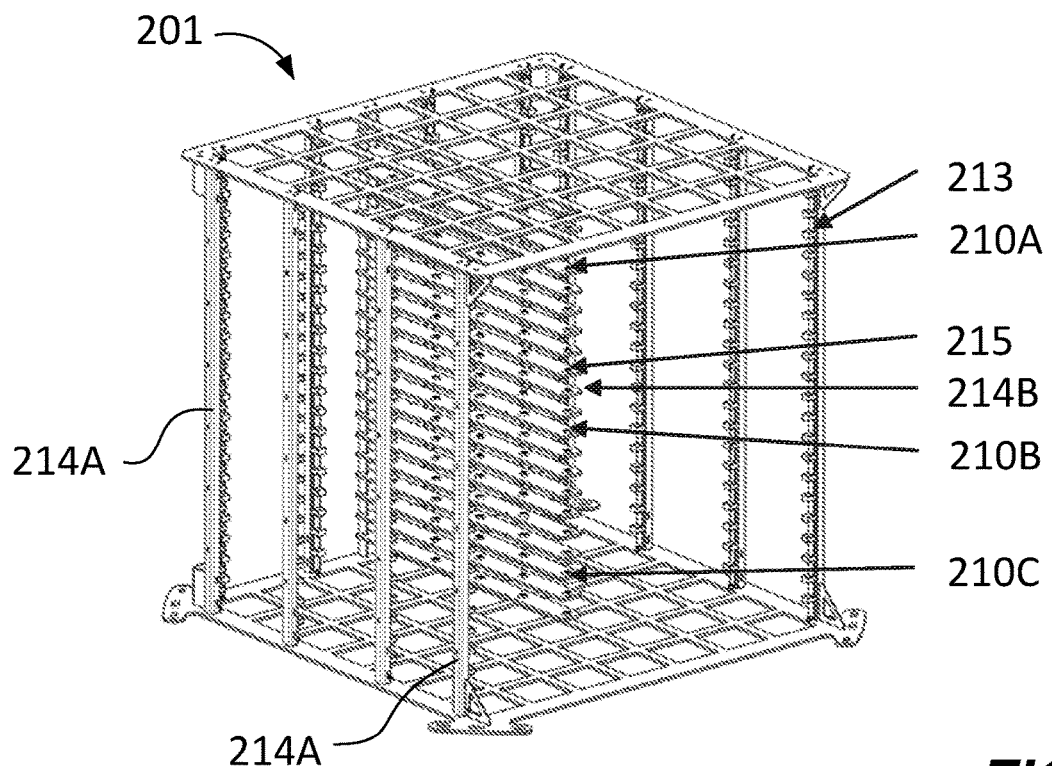
FIGS. 4A and 4B are illustrations of a rack used to support substrates in the processing chamber of FIG. 3A.
Figure 4B:
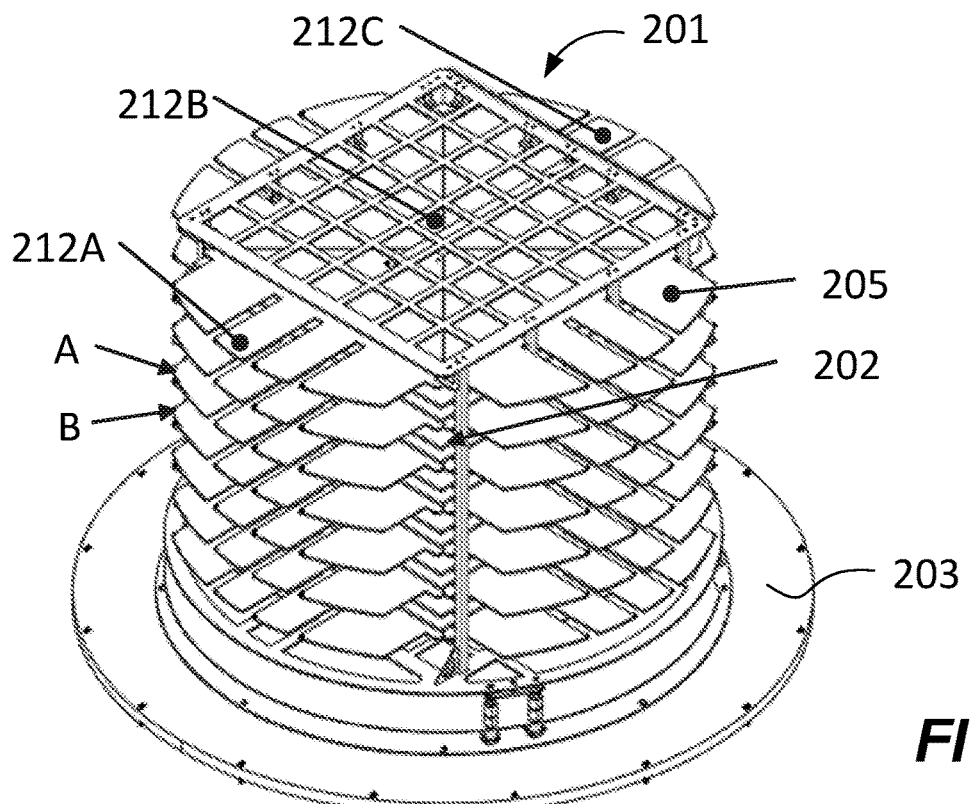

FIGS. 4A and 4B illustrate an exemplary rack 201 that may be used with oven 100. FIG. 4A illustrates an empty rack 201 and FIG. 4B illustrates a rack 201 loaded with substrates 202 and panels 205 (discussed later). With reference to FIG. 4A, rack 201 includes a support structure 213 for supporting the substrates 202 and panels 205. In some embodiments, support structure 213 may include peripheral supports 214A positioned around the outer boundary of rack 201. In some embodiments, support structure 213 may also include central supports 214B. In some embodiments, center supports 214B may include buttons 215 that support the substrates 202 and panels 205 loaded on rack 201. The supports 214A, 214B and buttons 215 may be made of, or include any material that will not contaminate the substrates 202. In some embodiments, supports 214A, 214B and buttons 215 may include metal, quartz or ceramic. In some embodiments, supports 214A, 214B and buttons 215 may include quartz or alumina. Rack 201 may include a plurality of thermocouples configured to measure the temperature of the substrates 202 loaded thereon. These thermocouples may include thermocouples 210A, 210B, and 210C placed along the center supports 214B preferably near the substrate center in the upper, middle, and lower regions of rack 201 for feedback to the control system for heating uniformly across the regions.

With reference to FIG. 4B (see also FIGS. 2 and 3A), prior to placing rack 201 in process chamber 200, rack 201 is loaded with substrates 202 and panels 205. Panels 205 may have a plate-like configuration and may be made of any thermally conductive and reflective material (e.g., aluminum) that is configured to radiate heat. In some embodiments, panels 205 may be made of a thermally conductive material such as aluminum and may be reflective. In some embodiments, the aluminum panels 205 may be electroless nickel plated to allow efficient reflection of infra-red radiation. In some embodiments, panels 205 may be made of high emissivity material such as, for example, anodized aluminum or silicon carbide to efficiently absorb and reradiate thermal energy to adjacently positioned substrates 202. In some embodiments, panels 205 may be removably positioned in rack 201. In some embodiments, panels 205 are fixed to rack 201, while substrates 202 are removably placed in rack 201 by the robot.

Figure 5A:
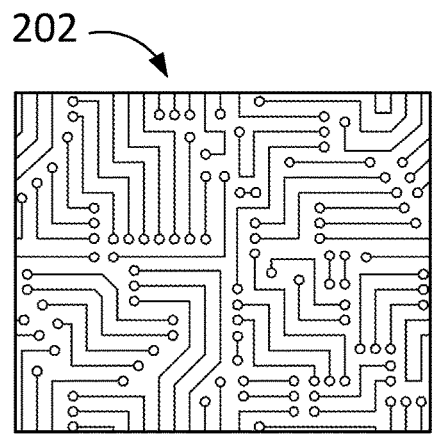
FIGS. 5A-5D are illustrations of different exemplary substrates that can be processed in the processing chamber of FIG. 3A.
Figure 5B:
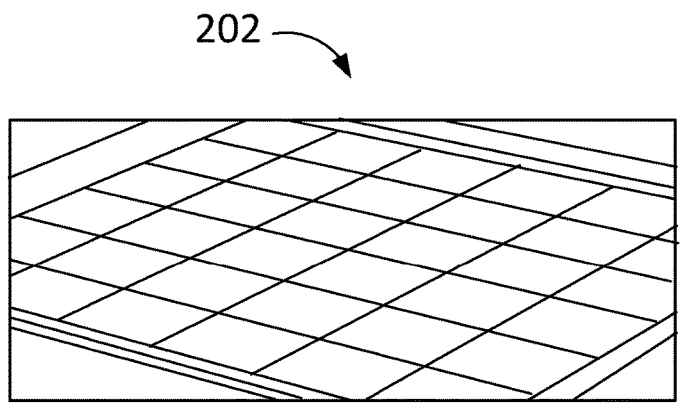
Figure 5C:
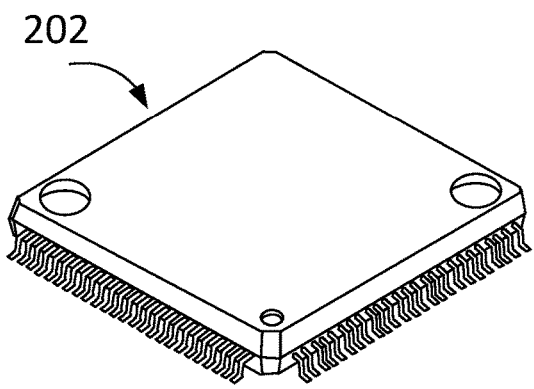
Figure 5D:
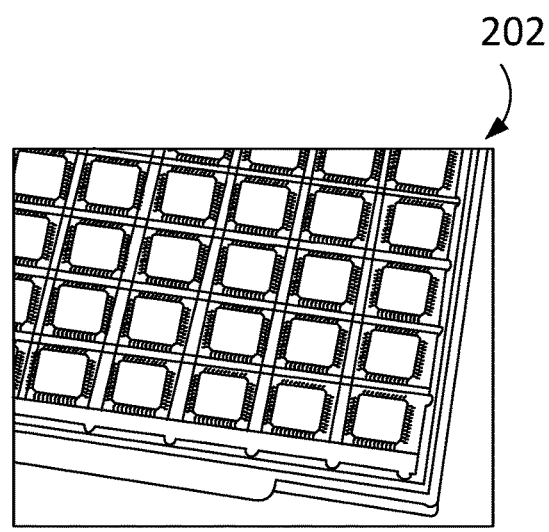

Substrate 202 may include any component (e.g., printed circuit boards, IC chips, semiconductor wafers, etc.) that is desired to be processed in process chamber 200 of oven 100. In some embodiments, as illustrated in FIG. 5A, each substrate 202 may include a single printed circuit board (PCB). In some embodiments, each substrate 202 may include multiple connected or discrete PCBs arranged in a plane (e.g., XY plane). In some embodiments, as illustrated in FIG. 5B, each substrate 202 may include an array of semiconductor dies (or chips) arranged in a plane (before or after dicing). In some embodiments, each substrate 202 may include a single semiconductor die. In some embodiments, as illustrated in FIG. 5C, each substrate 202 may include a single semiconductor device (e.g., a packaged semiconductor device). In some embodiments, as illustrated in FIG. 5D, each substrate 202 may include multiple semiconductor devices arranged in a plane. It should be noted that the above-described embodiments of substrates 202 are only exemplary. In general, substrate 202 may include any workpiece that is desired to be processed in process chamber 200 of oven 100.

With reference to FIG. 4B, in rack 201, one or more substrates 202 are positioned between two adjacent panels 205 (for example, between panels 205 marked A and B, see also FIG. 3A). In some embodiments, two substrates 202 may be positioned in a vertically spaced-apart manner between two adjacently positioned panels 205 (e.g., panels A and B of FIGS. 3A and 4B). For example, in the embodiment illustrated in FIG. 3A, two substrates 202 (marked x and y) are positioned in a vertically spaced-apart manner between the two panels 205 marked A and B. That is, a vertical gap is formed between each of the two substrates 202 (x and y) and the panels 205 (A and B). In some embodiments, only one substrate 202 may be positioned between two adjacent panels 205 (e.g., panels A and B). In some embodiments, more than two substrates 202 may be positioned between adjacent panels (e.g., panels A and B).

The same or a different number of substrates 202 may be positioned between each pair of adjacent panels 205 in rack 201. In some embodiments, substrates 202 (one, two, or a different number) may only be positioned between selected pairs of panels 205 of rack 201. For example, in some embodiments, substrates 202 may not be positioned between the pair of adjacent panels 205 at the top and bottom of rack 201, and two substrates 202 may be poisoned between other pair of adjacent panels 205 (see, for example, FIG. 3A). The substrates 202 and panels 205 may be positioned in rack 201 such that they are spaced apart from each other in the vertical direction. That is, substrates 202 and panels 205 are vertically stacked together in rack 201 with a gap between the adjacent substrates 202 and panels 205 (see, for example, FIG. 3A). In other words, adjacently positioned substrates 202 and panels 205 in rack 201 do not contact each other. Instead, they are vertically spaced apart such that there is a gas flow path formed between them.

Figure 6:
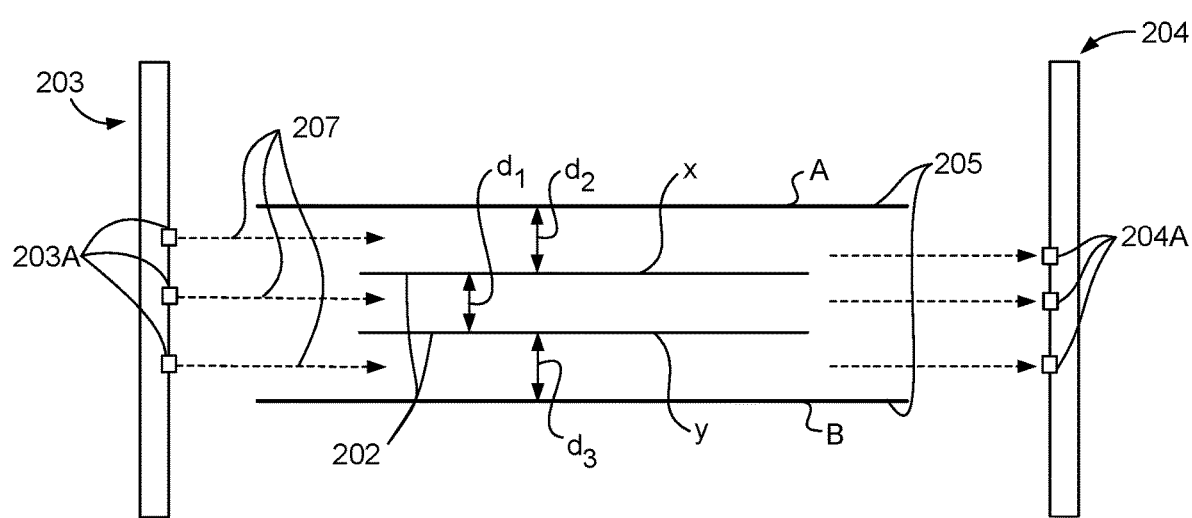
FIG. 6 is a schematic illustration of the placement of substrates and panels in the processing chamber of FIG. 3A.

For example, with reference to FIG. 6 which schematically illustrates the two substrates 202 marked x and y between panels A and B of FIG. 3A, substrates x and y may be vertically spaced apart by a distance $d_1$, substrate x may be spaced apart from the top panel A by distance $d_2$, and substrate y may be spaced apart from the bottom panel B by distance $d_3$. Substrates 202 may be similarly arranged between the other panels 205 of rack 201. Distances $d_1$, $d_2$, and $d_3$ may be the same or may be different, and may have any suitable value, for example, between 2-50 mm (or between 5-30 mm). In some embodiments, $d_1$, $d_2$, and $d_3$ may have the same value between about 5-30 mm (e.g., 25 mm). In some embodiments, the gap between the substrates 202 and panels 205 may be based on the size of substrates 202. For example, the gap may be larger with larger substrates 202 and smaller with smaller substrates 202 (or vice versa). The substrates 202 and panels 205 may be supported in rack 201 by supports 214A, 214B and buttons 215 of support structure 213. As will be described later, the vertical gap between the substrates 202 and panels 205 allow hot gases to flow through the rack 201 and heat the substrates 202 and panels 205 by convection. Additionally, the panels 205 (A and B) positioned on either side of the substrates 202 (x and y) in rack 201 allow the substrates 202 to be heated by radiation from the panels 205. For example, in addition to convection heat transfer, substrate x may be heated by radiation from panel A and substrate y may be heated by radiation from panel Y.

In use, lift 204 of oven 100 (see FIG. 2) raises rack 201 and seals seal plate 203 against the walls (e.g., flange 323)

of process chamber 200 such that rack 201 loaded with substrates 202 and panels 205 is sealed within process chamber 200. After sealing, process chamber 200 is evacuated using vacuum pump 108 to a low predetermined pressure (e.g., ≤200 torr, ≤100 torr, between 30-60 torr, etc.). Nitrogen or another inert gas is then introduced through a gas inlet to the chamber 200 to raise the pressure in process chamber 200 to a higher predetermined pressure (e.g., ≥250 torr, ≥350 torr, between 400-600 torr, etc.). This pulsed vacuum process is repeated (i.e., the pressure in the chamber is cycled between a lower-pressure and a higher-pressure multiple times) to reduce the oxygen content in the chamber. The lower-pressure and higher-pressure during each pulsing may be the same or different. In some embodiments, process chamber 200 may be cycled between a lower-pressure (e.g., ≤200 torr, ≤100 torr, between 30-60 torr, etc.) and near atmospheric pressure (e.g., ≥250 torr, ≥350 torr, between 400-600 torr, etc.) a plurality of times to reduce the oxygen content in the chamber to ≤100 ppm. The oxygen content in process chamber 200 may be analyzed using oxygen analyzer 109 (see FIG. 1B). In some embodiments, vacuum pump 108 is used to exhaust process chamber 200 and reduce the pressure in chamber 200. Inert gas, such as nitrogen, is then introduced to chamber 200 via a gas inlet 218. U.S. Pat. Nos. 10,147,617 and 10,319,612 describe exemplary processing steps that may be carried out in process chamber 200.

With reference to FIGS. 3A and 3C, in some embodiments, gas inlet 218 may be coupled to a gas inlet dissipater 203 positioned inside chamber 200. In some embodiments, the inlet dissipater 203 may include multiple (e.g., 6-20) tubes that extend along the length of the cylindrical process chamber 200 (see FIG. 3A). These tubes may be arranged circumferentially to form a partial arc around the inside of the chamber wall (see FIG. 3C). The multiple tubes are fluidly connected (e.g., at the top and/or bottom) and provided with an inert gas (e.g., nitrogen) via gas inlet 218. The tubes of inlet dissipater 203 include openings, or gas intel ports 203A, that direct a gas into the chamber 200. The gas flow into chamber 200 from intel ports 203A is shown using arrows 207 in FIG. 3A (and FIG. 6). Multiple intel ports 203A may be positioned along the length of the multiple tubes that form inlet dissipater 203. In some embodiments, intel ports 203A may be positioned such that the gas emanating from these openings (or gas intel ports 203A) are directed into the vertical gap between the substrates 202 and panels 205 in rack 201. With reference to FIG. 6, in embodiments, where the gap between the substrates 202 and panels 205 is, for example, about 25 mm (e.g., $d_1$, $d_2$, $d_3$ of FIG. 6 are all about 25 mm), gas intel ports 203A of inlet dissipater 203 may also be vertically spaced apart at a pitch of about 25 mm and arranged such that their vertical position aligns with the gaps between substrates 202 and panels 205 in rack 201.

Process chamber 200 also includes a gas exhaust dissipater 204 that may be connected to vacuum pump 108 (see FIG. 1B). Gas exhaust dissipater 204 may be used to remove the gas from process chamber 200 and pump down the chamber to a low pressure. In some embodiments, as illustrated in FIG. 3C, exhaust dissipater 204 may be positioned opposite inlet dissipater 203 such that rack 201 is positioned between the inlet and exhaust dissipaters 203, 204. In some embodiments, exhaust dissipater 204 may also have a configuration like that of inlet dissipater 203. That is, exhaust dissipater 204 may also include multiple (e.g., 6-20) tubes that extend along the length of the cylindrical process chamber 200 (see FIG. 3A), and the multiple tubes of exhaust dissipater 204 may be circumferentially arranged to form a partial arc around the inside of the chamber wall (see FIG. 3C). The multiple tubes that form exhaust dissipater 204 are fluidly connected (e.g., at the top and/or bottom) and coupled to a gas outlet connected to vacuum pump 108. Like inlet dissipater 203, the tubes of the exhaust dissipater 204 may also include openings, or gas outlet ports 204A (see FIG. 6), that direct the gas out of process chamber 200. Multiple gas outlet ports 204A may be positioned along the length of the multiple tubes of exhaust dissipater 204 and aligned like gas intel ports 203A of inlet dissipater 203.

In some cases, the gas entering process chamber 200 through gas intel ports 203A of the inlet dissipater 203 may be heated or cooled. For example, after loading rack 201 in process chamber 200, the process chamber 200 may be subject to the previously-described pulsed vacuum process while subjecting the process chamber 200 to heating and/or cooling steps. After the oxygen concentration in process chamber 200 is at or below the desired value, the substrates 202 in process chamber 200 may be heated and cooled in accordance with any desired temperature profile. During a heating step, hot gas may be directed into chamber 200 through gas inlet ports 203A to heat substrates 202. And, during a cooling step, cool gas may be directed into process chamber 200 through gas inlet ports 203A to cool substrates 202. With reference to FIG. 6, during the heating step, hot gas flows through the gap between substrates 202 and panels 205 (i.e., gaps $d_1$, $d_2$, and $d_3$) and heats the opposite surfaces (top and bottom surfaces) of substrates 202 by convention. Similarly, during the cooling step, cool gas flowing through the gaps between substrates 202 and panels 205 cools the substrates 202. Along with substrates 202, panels 205 in rack 201 above and below substrates 202 also gets heated or cooled by the gas flowing through the gaps.

During the heating step, in addition to convection heat transfer from the hot gas, the heated panels 205 also heat adjacent substrates 202 by radiation. For example, with reference to FIG. 6, panel A heats substrate x (and the substrate above panel A) by radiation and panel B heats substrate y (and the substrate positioned below panel B) by radiation. In other words, during the heating step, substrates 202 in process chamber 200 gets heated by convection from the hot gas flowing across the surfaces of substrates 200 and by radiation from the heated panels 205. This combined heating of the substrates 202 increases their rate of heating (or ramp rate) and reduces the time needed to reach the desired temperature. Similarly, during the cooling step, panels 205 absorb heat from adjacent substrates 202 and assist in increasing the rate of cooling of substrates 202. Forming panels 205 using thermally conductive reflective materials assist in transferring heat between substrates 202 and panels 205 by radiation. Thus, positioning panels 205 above and below substrates 202 in rack 201 in a vertically spaced-apart manner assists in increasing the rate of heating and cooling of substrates 202.

The vertical gaps between substrates 202 and panels 205 (i.e., gaps $d_1$, $d_2$, and $d_3$) in rack 201 allows the gas to flow between them and evenly heat or cool all regions (e.g., center, edges, etc.) of substrates 202. For example, if substrates 202 and panels 205 are stacked such that there is no gap (or only a small gap) between them, the outer edges of substrates 202 would get hotter or colder faster than their inner (e.g., central regions). This temperature differential between different regions of substrates 202 increases the time needed to process substrates 202, and may also induce thermo-mechanical stresses in substrates 202. For example, a temperature differential between the outer edges and central regions of substrates 202 may result in differential thermal expansion, warpage, and resulting thermomechanical stresses. The gap between substrates 202 and panels 205 (i.e., $d_1$, $d_2$, and $d_3$) may be configured such that gas can flow between them with relative ease. Aligning gas inlet ports 203A of inlet dissipater 203 to the vertical gap between substrates 202 and panels 205 assists in directing the flow of the gas through the gap between substrates 202 and panels 205. Thus, hot, or cold gas enters process chamber 200 through inlet dissipater 203, flows across substrates 202 to transfer heat to or from substrates 202 by convection, and exits chamber 200 through exhaust dissipater 204.

If the resistance to the flow of gas through the rack 201 (i.e., through the gap between substrates 202 and panels 205) is higher than the resistance to gas flow around the rack 201 (i.e., through the top and bottom of rack 201 in FIG. 3C), more of the gas will tend to flow around the rack 201 rather than through the rack 201. To minimize the flow of gas around the rack 201, flow baffles 206 are positioned in chamber 200 in the open space between rack 201 and the walls of process chamber 200. In the embodiment illustrated in FIG. 3C, the tubes of inlet dissipater 203 and exhaust dissipater 204 are positioned on diametrically opposite sides of process chamber 200 along the x-axis, and the flow baffles 206 are positioned on diametrically opposite sides of process chamber 200 along the y-axis. In this configuration, the flow baffles 206 increase the resistance to gas flow around the rack 201 and forces the gas (or more of the gas) to flow through the rack 201.

The flow baffles 206 may have any shape, size, and configuration configured to increase the resistance to gas flow. In some embodiments, these flow baffles 206 may be vanes, vents, louvres, flow deflectors, or other structures (e.g., a plate with holes, structures blocking passage, etc.) configured to restrict the flow of gas therethough. In some embodiments, flow baffles 206 may be attached to an inner wall 208 of process chamber 200 and extend towards rack 201. In some embodiments, flow baffles 206 may be attached to rack 201 and extend towards wall 208. As illustrated in FIG. 3C, the presence of the flow baffles 206 create recirculation zones (illustrated using spiral lines) on either side of rack 201 as the gas encounters these baffles 206. The resulting increase in flow resistance forces the gas to flow through rack 201 (rather than around it). Thus, the flow baffles 206 result in an increase in gas flow through the gaps between substrates 202 and baffles 205 in rack 201 (i.e., gaps $d_1$, $d_2$, and $d_3$ of FIG. 6) and increase convective heat transfer to and from the gas to substrates 202 and baffles 205.

As described previously, inlet dissipater 203 directs hot or cold gas into process chamber 200 and exhaust dissipater 204 directs the gas out of process chamber 200. In some embodiments, exhaust dissipater 204 directs the gas into chamber 200 and inlet dissipater 203 exhausts the gas from chamber 200. That is, inlet dissipater 203 and exhaust dissipater 204 may both be configured to direct gas into process chamber 200 and exhaust gas from chamber 200. As would be recognized by people of ordinary skill in the art, in such embodiments, these dissipaters 203, 204 may be connected to one or more valves and/or other flow control devices (not shown) that enable both dissipaters 203, 204 to be selectively used as the inlet and or outlet. In some embodiments, dissipaters 203 and 204 may be used as a gas inlet or a gas outlet in a cyclic manner. For example, during the heating cycle, hot gas may be directed into process chamber 200 through dissipater 203 (and exhausted from chamber 200 through dissipater 204) for a first time period. The flow of gas may then be reversed and hot gas directed into chamber 200 through dissipater 204 (and exhausted from chamber 200 through dissipater 203) for a second time period to evenly heat substrates 202 from opposite sides. Additionally, or alternatively, in some embodiments, rack 201 may be rotated (e.g., like a turntable) in chamber 200 to enable uniform gas temperature distribution across substrates 202 and optimize substrate temperature uniformity.

A control system 400 (see FIG. 1A) may control the operations of process chamber 200. Control system 400 may include one or more processors, memory devices, and/or other electronic devices for receiving input (e.g., sensor input) associated with the operation of oven 100 (input related to temperature, pressure, gas flow, time at temperature/pressure, etc.), analyzing the received input, controlling the operation of chamber 200 and other systems (e.g., lift 204) of oven 100 based on the received data, and providing feedback to a user of oven 100. The control system 400 may be configured to receive from a user and store multiple process recipes (i.e., temperature and/or pressure profiles) that may be run in oven 100. In some embodiments, a user may select (and in some case, modify) a stored process recipe for execution, and the control system 400 may run the selected recipe. The control system 400 may then receive sensor input from the oven 100, and using the received feedback, control the operation of oven 100. As would be recognized by persons skilled in the art, the processor(s) of control system 400 may be configured to perform logic operations on the received sensor input and stored data, provide control signals to oven, and provide user feedback based stored or accessible software instructions that provide the desired functionality. The control system 400 may include different controllers that provide different types of functionality to the control system 400.

Among other sensors, process chamber 200 may include temperature sensors that provide input to control system 400. In some embodiments, as schematically illustrated in FIG. 4A, rack 201 may include a multiple thermocouples 210A, 210B, and 210C configured to measure a temperature distribution along a length of rack 201 (i.e., along a longitudinal axis of the cylindrical chamber 200). In some embodiments, these thermocouples 210A, 210B, and 210C may be attached to the center support of support structure 213, preferably near the substrate center, in the upper, middle, and lower regions of rack 201. Control system 400 may use the signals received from these thermocouples 210A, 21B, 210C to determine the heating uniformly across the length of rack 201. In some embodiments, as illustrated in FIG. 4B, thermocouples 212A, 212B, and 212C may be attached to one (or more) of panels 205 to determine the temperature uniformity along a width of rack 201 (i.e., along a diameter of the cylindrical chamber 200). Preferably, these thermocouples may be attached to the leading edge, center, and trailing edge in the flow direction of the gas for feedback to control system 400. It should be noted that the number and specific locations of the thermocouples described above are only exemplary. In general, process chamber 200 may have any number of thermocouples, attached to any location of chamber 200, that provide input to control system 400. Any type of thermocouples may be used.

Control system 400 (or a heating controller of control system 400) may use the signals received from the thermocouples in process chamber 200 to determine the heating uniformly across the length and width of rack 201. Based on these inputs, control system 400 may control the temperature and/or flow rate of the gas directed into process chamber 200 to maintain or achieve temperature uniformity. For example, control system 400 may include a proportionalintegral-derivative (PID) controller (or another suitable controller) that uses a control loop mechanism and/or algorithm that controls the temperature and/or flow rate of the gas entering the chamber 200 using feedback from the thermocouples.

It should also be noted that, although panels 205 of rack 201 are described as being passive panels that gets heated or cooled by the gas directed in process chamber 200, this is only exemplary. In some embodiments, one or more of panels 205 in rack 201 may have heaters (and/or coolers) incorporated or embedded therein. In such embodiments, the actively heated or cooled panels 205 may transfer heat to, or from, adjacent substrates 202 in rack 201 by radiation. The heaters and/or coolers incorporated in panels 205 may assist in heating and cooling hard to reach areas (e.g., central areas) of substrates 202 in rack 201. Any type of heater or cooler (resistance heater, infrared heater, fluid circulating plate, etc.) may be used to heat or cool panels 205. U.S. patent application Ser. No. 16/851,977, filed on Apr. 17, 2020 and incorporated by reference in its entirety herein, discloses some exemplary methods that may be used to actively heat or cool panels 205. In this disclosure, panels 205 that do not have heaters or coolers incorporated in them (i.e., the panels that gets heated/cooled only by the gas in chamber 200) are referred to as "passive panels," and panels 205 that have heaters and/or coolers incorporated therein are referred to as "active panels."

In some embodiments, in addition to heating the substrates 202 in rack 201 using the hot gas introduced into process chamber 200, the process chamber 200 may include additional heaters 310, 312, 314 (see FIG. 3A) to increase the ramp rate and improve zone to zone temperature uniformity in rack 201. These heaters 310, 312, 314 may be sized and controlled (by control system 400) such that the temperature in all regions of the rack 201 is uniform. In some embodiments, the heaters 310, 312, and 314 may be band heaters that extend circumferentially around the outer wall of chamber 200. In some embodiments, a thermal interface pad (e.g., a continuous graphite sheet, etc.) may be positioned between the heaters 310, 312, 314 and the outer wall of the chamber 200 to improve conductive heat transfer from the heaters to the wall of the chamber 200. The thermal interface pad may be relatively soft such that it fills the area between the heaters and the chamber wall and reduces the thermal interface resistance between the heaters and the wall. During use, the heaters 310, 312, 314 heat the wall of the chamber 200 by conduction, and the hot chamber walls heat the substrates 202 and panels 205 in rack 201 (e.g., by convection and/or radiation). Thus, in addition to the hot gas in process chamber 200, the heaters 310, 312, 314 incorporated in the wall of the chamber 200 assist in heating the substrates 202 (and panels 205) in rack 201 to further increase ramp rate.

With reference to FIG. 3A, heater 314 assists in heating the substrates 202 in the lower portion or zone of rack 201, heater 312 assists in heating the substrates 202 in the middle portion of rack 201, and heater 310 assists in heating the substrates 202 in the upper portion of rack 201. The heaters may be sized and/or controlled such that the temperature of the substrates 202 in the lower, middle, and upper portions of the rack 201 are uniform. For example, since heat rises, substrates 202 in the lower portion of rack 201 may tend to be cooler than those in the middle and upper portions. Therefore, to enable heater 314 to heat the substrates 202 in the lower portion of rack 201 more, heater 314 may be sized to be larger (or have larger heating capacity) than heaters 312 and 310. For example, in some embodiments, heater 314 may be a 9 KW heater while heaters 312 and 310 are 6 KW heaters.

Additionally, or alternatively, in some embodiments, signals from the thermocouples in process chamber 200 (e.g., thermocouple 210A, 210B, 210C, 212A, 212B, 212C in rack 201) may be used to control the heaters 310, 312, 314 such that the substrates 202 in rack 201 are uniform in temperature. In some embodiments, control system 400 may include a proportional integral derivative (PID) controller that uses feedback from the thermocouples to make the temperature of chamber 200 (or substrates 202) match a setpoint temperature (i.e., adjust heating of chamber 200 until the thermocouple feedback approaches or becomes the setpoint temperature). For example, using signals from the thermocouples as feedback, the PID controller of control system 400 may control the heaters 310, 312, 314 (and/or temperature and/or flow rate of gas introduced into chamber 200) such that the temperatures of all substrates 202 in rack 201 are uniform (e.g., within an acceptable threshold temperature value). For example, with reference to FIG. 3A, if the thermocouples indicate that the substrates 202 in the bottom portion of rack 201 are cooler than those in the top portion, the control system 400 may increase the heating provided by heater 314 (compared to heaters 310 and 312). It should be noted that, although three heaters 310, 312, 314 are shown in FIG. 3A, this is only exemplary. In general, any number of heaters may be positioned at different locations (e.g., height) of chamber 200.

In some embodiments, thermocouples 311, 313, and 315 (see FIG. 3A) (alone or in conjunction with thermocouples 212A, 212B, and 212C (see FIG. 4B) and/or thermocouples 210A, 210B, and 210C (see FIG. 4A)) provide feedback to the control system 400 to govern power applied to heaters 310, 312, and 314 to control the chamber wall temperature and thereby control the temperature of substrates 202 in chamber 200. For example, inputs from the thermocouples in chamber 200 may indicate that the temperature of substrates 202 in chamber 200 (or temperature of the chamber 200) is below the desired value. And, in response, control system 400 may activate heaters 310, 312, and 314 to increase the temperature of substrates 202. Alternatively, or additionally, in some embodiments, based on input from the thermocouples, control system 400 may control the flow rate and/or temperature of the gas introduced into chamber 200 (e.g., via inlet dissipater 203) to increase the temperature of the chamber 200 (or substrates 202 in chamber 200) to the desired temperature.

In some embodiments, based on input from the thermocouples in chamber 200, control system 400 may detect that the temperature of the substrates 202 in chamber 200 is non-uniform (or that the temperature difference of the substrates 202 is above a predetermined threshold). For example, thermocouples 210A, 210B, and 210C (or thermocouples 311, 313, and 315) may indicate that the temperature of the substrates 202 in the lower portion of the rack 201 is lower than those in the middle and upper portions. And, in response, control system 400 may selectively activate heater 314 (i.e., turn heater 314 on and heaters 310 and 312 off), or increase the power directed to heater 314 as compared to heaters 310 and 312, to selectively heat the substrates 202 in the lower portion of rack 201 more and thereby make the temperature of the substrates 202 in chamber 200 uniform (e.g., within a desired threshold). Alternatively, or additionally, in some embodiments, when a temperature non-uniformity of the substrates 202 in chamber 200 is detected, control system 400 may control (i.e., increase or decrease) the flow rate and/or temperature of the gas introduced into chamber 200 to make the temperature of the substrates 202 in chamber 200 within a desired threshold. In some embodiments where panels 205 are active panels, when the temperature of sub states 202 in a region of the rack 201 is detected to be lower than the substrates at other regions, the panels 205 adjacent (e.g., above and/or below) the cooler substrates may be activated to selectively heat these substrates by radiation from the activated panels 205.

In some embodiments, control system 400 may detect that there is a temperature non-uniformity across the diameter of chamber 200. For example, input from thermocouples 212A, 212B, and 212C may indicate that the temperature at the trailing edge of substrate 202 (e.g., the end of substrate 202 near the exhaust dissipater 204) is less than the temperature at the leading edge (e.g., the end of substrate 202 near the inlet dissipater 203) and/or the temperature at the center of substrate 202. And, in response, control system 400 may increase (or decrease) the flow rate and/or the temperature of the gas directed into chamber 200 through inlet dissipater 203. In some embodiments, in response to a detection of temperature non-uniformity across the diameter of chamber 200, control system 400 may direct the gas into chamber 200 through exhaust dissipater 204 and exhaust the gas from chamber 200 through the inlet dissipater 203. That is, reverse the direction of gas flow in chamber 200. It is also contemplated that, in some embodiments, in response to a detection of temperature non-uniformity across the diameter of chamber 200, control system 400 may rotate the rack 201 (e.g., as a turntable) to make the temperature of the substrates 202 uniform across the diameter.

Figure 7:
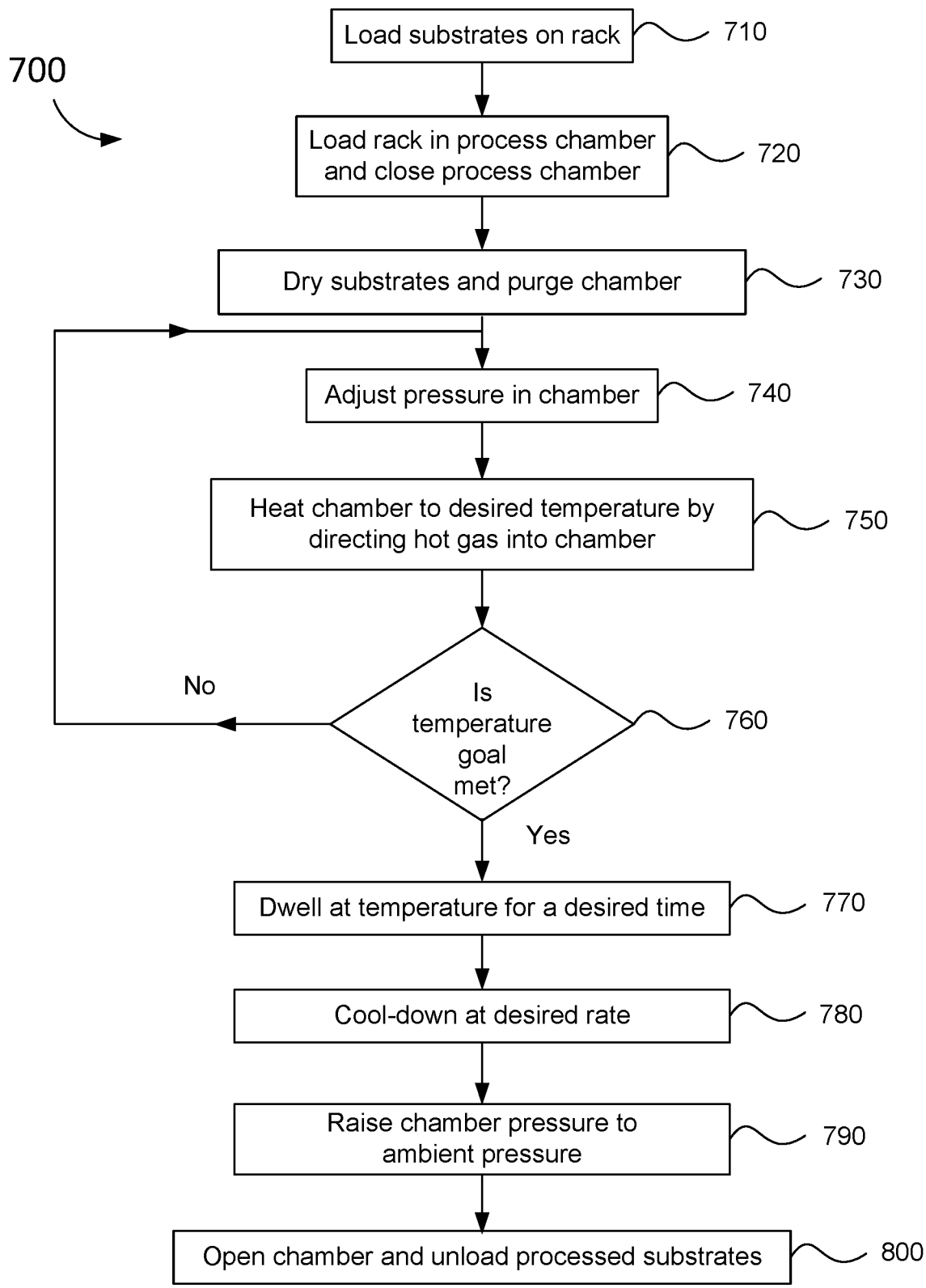
FIGS. 7 and 8 are flow charts of exemplary processing methods using the oven of FIG. 1A.

FIG. 7 is a flow chart of an exemplary method 700 of using oven 100. Substrates 202 and panels 205 (active or passive panels) are first loaded on a rack 201 (step 710). As explained previously (for example, with reference to FIG. 6), the substrates 202 and panels 205 are loaded on rack 201 such that there is a vertical gap between adjacent substrates 202 and panels 205 in rack 201. In general, rack 201 may include any number of substrates 202 (and panels 205) and, in step 710, any number (1, 2, 3, 4, etc.) of substrates 202 may be positioned between each adjacent pair of panels 205 or rack 201. In some embodiments, in step 710, rack 201 is loaded such a single substrate 202 is positioned between each adjacent pair of panels 205. In some embodiments, in step 710, two (or more) substrates 202 are positioned between each adjacent pair of panels 205. In some embodiments, as illustrated in FIG. 3A, two substrates 202 are positioned between each pair of panels 205 in the middle region of rack 201 and no substrates are positioned (or only one substrate is positioned) between the pair of panels 205 at the top and bottom of rack 201. In some embodiments, in step 710, the substrates 202 and panels 205 may be loaded on a rack 201 positioned on the seal plate 203 of oven 100. In some embodiments, the rack 201 may first be loaded with substrates 202 and panels 205 and the loaded rack 201 then placed atop the seal plate.

The elevator lift 204 of oven 100 is then operated to lift or elevate the seal plate 203 along with the loaded rack 201 and close the process chamber 200 (step 720). As previously explained (e.g., with reference to FIGS. 3A and 3B), in step 720, the seal plate 203 is raised to engage, and make a seal with, a flange 323 around the chamber opening of process chamber 200. In some embodiments, after the seal plate 203 engages with the flange 323, a vacuum pump is operated to pull a vacuum in an engagement area of the seal plate 203 and the flange 323 (e.g., in a space between two O-rings) to seal the seal plate 203 with process chamber 200.

The substrates 202 in processing chamber 200 are subject to one or more processing operations after sealing the chamber 200. In general, the substrates 202 may be subjected to any type of process that involves a high temperature or a low temperature step. Optionally, after sealing process chamber 200, the chamber 200 is subject to drying or purging steps to dry the substrates 202 and purge the chamber 200 such that the oxygen concentration in chamber 200 is at or below a desired level (step 730). The drying or purging (step 730) may include using a pulsed vacuum process (i.e., the pressure in the chamber 200 is cycled between a lower-pressure and a higher-pressure multiple times) to reduce the oxygen content in the chamber 200 to the desired value (such as, for example, ≤200 ppm, ≤100 ppm, ≤50 ppm, etc.). In some embodiments, the purging step (i.e., step 730) may be eliminated and the substrates 202 in the sealed chamber 200 may be directly subjected to processing operations (e.g., step 740).

Figure 8:
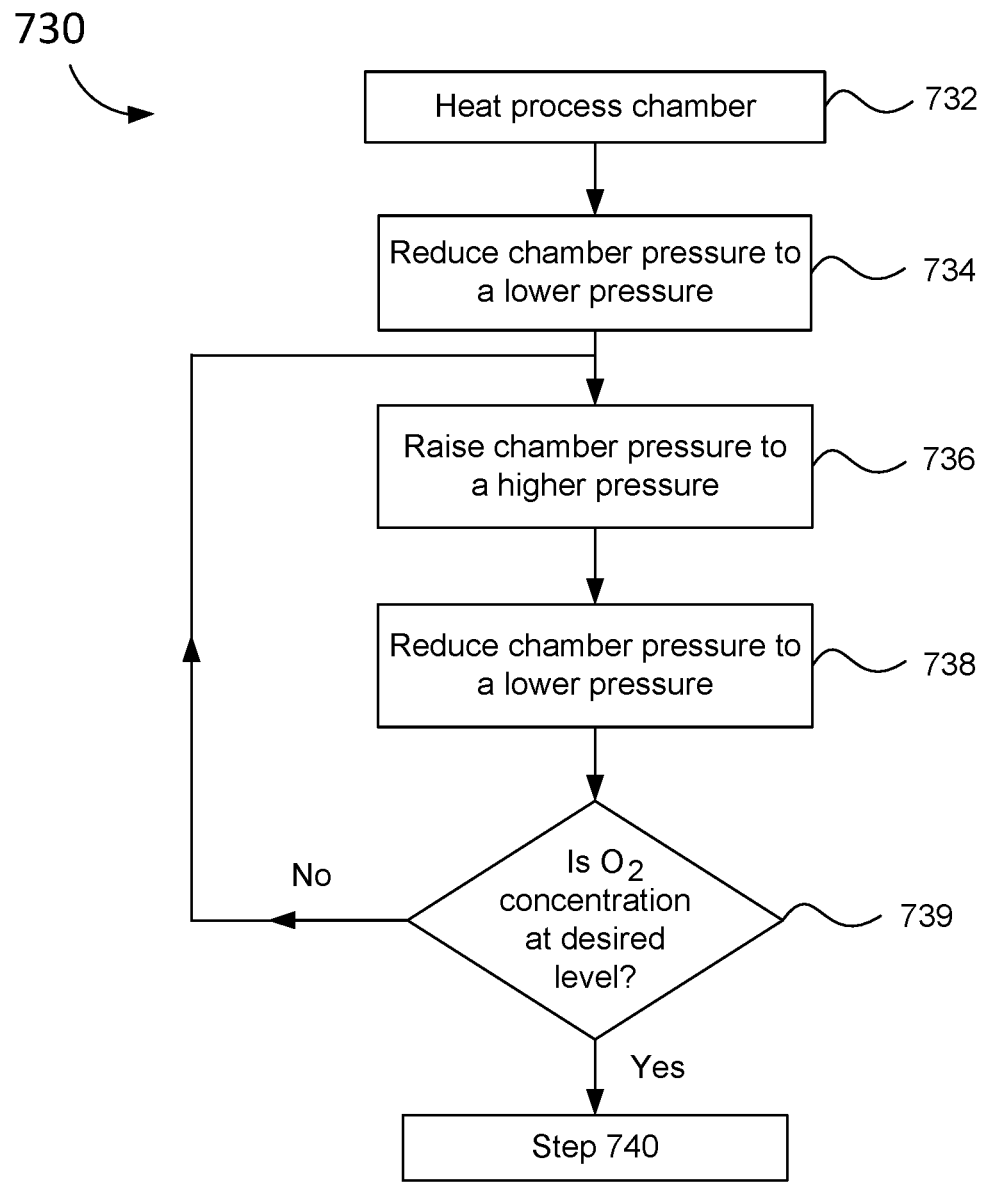

FIG. 8 is a flow chart that illustrates an exemplary (optional) purging step (i.e., step 730) of FIG. 7. The process chamber 200 is heated to a temperature of between about 100-300° C. (step 732). In some embodiments, in step 732, the chamber 200 may be heated to a temperature of between about 100-200° C., or about 150° C. To heat the process chamber 200 to the desired temperature (e.g., about 150° C. or any other temperature), gas at this temperature may be directed into process chamber 200 through inlet dissipater 203 and directed out of chamber 200 through exhaust dissipater 204 (see FIG. 3A). The hot gas flows through the gaps (e.g., gaps $d_1$, $d_2$, $d_3$ of FIG. 6) between the substrates 202 and panels 205 in the rack 201 positioned in chamber 200 and heats the substrates 202 and panels 205 by convection. The heated panels 205 also heat the adjacent substrates by radiation. Meanwhile, the control system 400 monitors the temperature signals from the thermocouples in chamber 200 to determine the temperature and temperature uniformity of the substrates 202 in chamber 200. Based on these temperature signals, the control system 400 controls the flow rate and/or the temperature of the gas flow into the process chamber 200 to achieve or maintain temperature uniformity. In some embodiments, the control system 400 may also activate one or more of the heaters 310, 312, 314 of chamber 200 to achieve/maintain temperature uniformity.

The pressure in chamber 200 is then reduced to a predetermined lower pressure, such as, for example, ≤200 torr, ≤100 torr, between 30-60 torr, etc. (step 734). In some embodiments, in step 734, the pressure in chamber 200 is reduced to about 50 torr. The vacuum pump 108 may be activated to reduce the chamber pressure to the desired lower pressure. Although not a requirement, in some embodiments, the pump may pump down the chamber 200 to the desired lower pressure in less than about 8 minutes, in about 1-4 minutes, or in about 2-3 minutes.

After reducing the chamber pressure to the desired lower pressure, heated gas (nitrogen gas or another inert gas) is directed into process chamber 200 to raise the pressure in chamber 200 to a predetermined higher pressure (e.g., ≥250 torr, ≥350 torr, between 400-800 torr, about 600 torr, etc.) (step 736). Heated gas may be directed into chamber 200 through inlet dissipater 203 until the chamber pressure increases to the desired higher pressure. In some embodiments, in step 736, the heated gas directed into chamber 200 may be at a temperature between about 100-200° C., or between about 125-175° C., or at about 150° C. The hot gas flows through the gaps (e.g., gaps $d_1$, $d_2$, $d_3$ of FIG. 6)

between the substrates 202 and panels 205 in chamber 200 and heats the substrates 202 and panels 205 by convection, and the heated panels 205 heat the adjacent substrates 202 by radiation. Meanwhile, the control system 400 monitors the temperature signals (from the thermocouples in chamber 200) and pressure signals and uses these signals to control the temperature and pressure in chamber 200. In some embodiments, the heaters 310, 312, 314 of chamber 200 may also be activated in step 736. Although not a requirement, in some embodiments, step 736 may take less than about 8 minutes, about 1-4 minutes, or about 2-3 minutes.

After increasing the pressure in chamber 200 to the predetermined higher pressure in step 736, the pressure in chamber 200 is again reduced to a lower pressure (step 738). In general, in step 738, the pressure in chamber 200 may be reduced to any pressure lower than the chamber pressure in step 736. In some embodiments, the chamber pressure may be reduced to be ≤200 torr, ≤100 torr, or to between 10-60 torr. In some embodiments, in step 738, the chamber pressure is reduced to the same pressure as in step 734. In some embodiments, in step 738, the chamber pressure is reduced to a lower pressure than in step 734. In some embodiments, in step 738, the chamber pressure is reduced to about 50 torr or to about 25 torr. Although not a requirement, in some embodiments, step 738 may take less than about 8 minutes, about 2-5 minutes, or about 3-4 minutes.

In some embodiments, steps 736 and 738 may be repeated several times (e.g., 2-10 times) until the oxygen concentration in chamber 200 is at or below the desired level (such as, for example, ≤200 ppm, ≤100 ppm, ≤50 ppm, etc.). Control system 400 may use the signals from oxygen analyzer 109 to determine if the oxygen concentration in chamber 200 is at the desired level (step 739), and perform repeated vacuum pulsing of the chamber 200 by repeating steps 736 and 738 until the oxygen concentration is at the desired level. When the oxygen concentration is at the desired level, the substrates 202 in chamber 200 may be subjected to one or more processing operations.

Referring to FIG. 7, the pressure in chamber 200 is then adjusted (increased or decreased) to the desired value (step 740). The substrates 202 in chamber 200 are heated to a desired temperature at the desired heating rate (step 750). Heated gas is the directed into chamber 200 to heat the substrates 202 to the desired value. The substrates 202 may be heated to any desired temperature value depending on the type of substrates 202 and the type of processing being carried out on these substrates. For example, if the processing being carried out is a temperature imidization process on substrates 202, the chamber pressure may be adjusted to be about 150-300 torr (or about 250 torr) in step 740, and heated gas (e.g., nitrogen) at about 200-500° C. (or between about 300-400° C., or about 350° C.) may be directed into chamber 200 in step 750. As another example, if the processing being carried out on substrates 202 is a solder reflow process, step 740 may be eliminated and heated gas at the reflow temperature of the solder being reflowed (or at a slightly higher temperature) may be directed into the chamber in step 750. In general, the substrates 202 may be heated to any temperature (e.g., ≤1200° C., 50-1000° C., 100-700° C., 100-500° C., 200-200° C. etc.) in step 750.

To heat the substrates 202 in step 750, heated gas is directed into chamber 200 through inlet dissipater 203 and directed out of chamber 200 through exhaust dissipater 204 (see FIG. 3A). The hot gas flows through the gaps (e.g., gaps d₁, d₂, d₃ of FIG. 6) between the substrates 202 and panels 205 in the rack 201 positioned in chamber 200 and heats the substrates 202 and panels 205 by convection. The heated panels 205 also heats the substrates 202 by radiation. The control system 400 monitors the temperature signals from chamber 200, and based on these temperature signals, control the flow rate and/or the gas temperature to achieve or maintain temperature uniformity in chamber 200 and the desired heating rate (step 760). In some embodiments, a PID controller of control system 400 may adjust the flow rate and/or temperature of the gas directed into chamber 200 to meet the temperature and heating rate goals of step 750. In some embodiments, in step 750, the control system 400 may also activate one or more of the heaters 310, 312, 314 of chamber 200 to achieve/maintain temperature uniformity and achieve desired heating rate. In embodiments where panels 205 of rack 201 are active panels, the panels 205 may also be activated to heat the panels 205 in step 750. The heated panels 205 may heat the adjacent substrates 202 by radiation. The panels 205 may be activated based on the type of active panels 205 used. For example, in embodiments where the active panels 205 include embedded resistance or infrared heating elements, these heating elements may be turned on to activate the panels 205. In embodiments where the active panels 205 include flow channels, a heated fluid may be directed through these flow channels to activate the panels 205.

The temperature in chamber 200 may be maintained at the desired temperature for a desired dwell time (step 770). The dwell time also depends on the type of processing being carried out in chamber 200. In some embodiments, in this step, the control system 400 may control the temperature of the gas and/or the heaters 310, 312, 314 to maintain the desired chamber temperature using input from the thermocouples as feedback. The temperature of the heaters 310, 312, 314 and/or the gas directed into chamber 200 may be controlled to cool down the substrates 202 to a desired temperature at the desired rate (step 780). In some embodiments, the flow rate of the gas into chamber 202 may also be adjusted to control the rate of cooldown. The pressure in chamber 200 may then be raised to ambient pressure (step 790). In some embodiments, gas (e.g., at ambient temperature) may be directed into chamber 200 to increase the pressure in chamber 200 to ambient pressure in step 490. The chamber 200 is then opened (step 800), for example, by lowering the seal plate 203, and the substrates 202 unloaded from the rack 201.

It should be appreciated that the described methods are only exemplary. These methods may include any number of additional or alternative steps. In some embodiments, some of the illustrated steps may be eliminated or combined with other steps. Further, the steps shown in FIGS. 7 and 8 need not be performed in the illustrated order, and the method may be incorporated into a more comprehensive process having additional steps not described in detail herein.

The above-described embodiments of the batch processing oven and method of operating the oven are only exemplary. Many variations are possible. Other embodiments of the oven will be apparent to those skilled in the art from consideration of the batch processing ovens disclosed herein.

What is claimed is:

1. A batch processing oven, comprising:
    a processing chamber;
    a rack configured to be positioned in the processing chamber, wherein the rack is configured to support a plurality of substrates and a plurality of panels in a stacked manner such that (a) one or more substrates of the plurality of substrates are positioned between at least one pair of adjacent panels of the plurality panels, and (b) vertical gaps separate each substrate of the plurality of substrates from an adjacent substrate or panel on either side of the substrate an inlet dissipater positioned on one side of the processing chamber, the inlet dissipater being configured to direct a gas into the processing chamber, wherein the inlet dissipater includes multiple inlet tubes extending in a lengthwise direction along an internal wall of the processing chamber, and wherein the multiple inlet tubes are arranged circumferentially to form a partial arc around the internal wall and each inlet tube of the multiple inlet tubes includes a plurality of inlet ports spaced apart from each other in the lengthwise direction;

an exhaust dissipater positioned on an opposite side of the processing chamber such that the rack is configured to be positioned between the inlet and exhaust dissipaters, the exhaust dissipator being configured to exhaust the gas from the processing chamber; and one or more flow baffles positioned on an internal wall of the processing chamber, the one or more flow baffles being configured to restrict a flow of the gas around the rack positioned in the processing chamber.

2. The oven of claim 1, wherein the processing chamber has a substantially cylindrical shape and the inlet dissipater and the exhaust dissipater are positioned on diametrically opposite sides of the processing chamber.

3. The oven of claim 1, wherein the plurality of inlet ports are aligned with the vertical gaps that separate each substrate in the rack from an adjacent substrate or panel.

4. The oven of claim 1, wherein the exhaust dissipater includes multiple outlet tubes extending in the lengthwise direction along the internal wall of the processing chamber, the multiple outlet tubes being arranged circumferentially to form a partial arc around the internal wall, and wherein each outlet tube of the multiple outlet tubes includes a plurality of outlet ports spaced apart from each other in the lengthwise direction.

5. The oven of claim 1, wherein the processing chamber includes one or more heaters positioned on an external wall of the processing chamber.

6. The oven of claim 1, wherein the rack includes a plurality of thermocouples attached thereto, and the oven further includes a control system configured to control operation of the processing chamber using signals from the plurality of thermocouples as feedback.

7. The oven of claim 1, wherein the processing chamber has a chamber opening at a bottom side of the processing chamber, and the rack is configured to be elevated into the processing chamber through the chamber opening.

8. The oven of claim 1, wherein the vertical gaps that separate each substrate of the plurality of substrates from an adjacent substrate or panel is between 2 mm and 50 mm.

9. The oven of claim 1, wherein at least one panel of the plurality of panels includes embedded heaters.

10. A method of operating a batch processing oven having a processing chamber wherein (i) the processing chamber includes an inlet dissipater and an exhaust dissipater positioned on diametrically opposite sides of the processing chamber such that a rack is configured to be positioned between the inlet and exhaust dissipaters and one or more flow baffles positioned on an internal wall of the processing chamber, the one or more flow baffles being configured to restrict a flow of a gas around the rack positioned in the processing chamber, (ii) wherein the inlet dissipater includes multiple inlet tubes extending in a lengthwise direction along an internal wall of the processing chamber, and (iii) wherein the multiple inlet tubes are arranged circumferentially to form a partial arc around the internal wall and each inlet tube of the multiple inlet tubes includes a plurality of inlet ports spaced apart from each other in the lengthwise direction, the method comprising:

positioning the rack in the processing chamber, wherein the rack supports a plurality of substrates and a plurality of panels in a stacked manner such that (a) one or more substrates of the plurality of substrates are positioned between at least one pair of adjacent panels of the plurality panels, and (b) vertical gaps separate each substrate of the plurality of substrates from an adjacent substrate or panel on either side of the substrate; and directing a flow of a hot gas into the processing chamber through the plurality of inlet ports of the inlet dissipater to heat the plurality of substrates; and restricting flow of the gas around the rack using the one or more flow baffles.

11. The method of claim 10, wherein the processing chamber includes one or more heaters positioned on an external wall of the processing chamber, and the method further includes activating the one or more heaters to heat the plurality of substrates supported in the rack.

12. The method of claim 10, wherein the rack includes a plurality of thermocouples attached thereto, and wherein directing a flow of a gas into the processing chamber includes controlling a temperature or a flow rate of the gas directed into the processing chamber using signals from the plurality of thermocouples as feedback.

13. The method of claim 10, wherein the processing chamber has a chamber opening at a bottom side of the processing chamber, and positioning a rack in a processing chamber includes elevating the rack into the processing chamber through the chamber opening.

14. A batch processing oven, comprising:

a substantially cylindrical processing chamber;

an inlet dissipater including multiple inlet tubes extending in a lengthwise direction along an internal wall of the processing chamber, the multiple inlet tubes being arranged circumferentially to form a partial arc around the internal wall, each inlet tube of the multiple inlet tubes including a plurality of inlet ports spaced apart from each other in the lengthwise direction, the plurality of inlet ports being configured to direct a gas into the processing chamber;

an exhaust dissipater positioned diametrically opposite the inlet dissipater, the exhaust dissipater being configured to exhaust the gas from the processing chamber;

a rack configured to be positioned in the processing chamber, wherein the rack is configured to support a plurality of substrates and a plurality of panels in a stacked manner such that (a) one or more substrates of the plurality of substrates are positioned between at least one pair of adjacent panels of the plurality panels, and (b) vertical gaps separate each substrate of the one or more substrates from an adjacent substrate or panel on either side of the substrate; and one or more flow baffles positioned on an internal wall of the processing chamber, the one or more flow baffles being configured to restrict a flow of the gas around the rack positioned in the processing chamber.

15. The oven of claim 14, wherein the rack includes a plurality of thermocouples attached thereto, and the oven further includes a control system configured to control a flow rate or a temperature of the gas directed into the processing chamber using signals from the plurality of thermocouples as feedback.

16. The oven of claim 15, further including a plurality of heaters coupled to the processing chamber, wherein the control system is configured to selectively activate one or more heaters of the plurality of heaters based on signals from the plurality of thermocouples.

17. The oven of claim 14, wherein the processing chamber has a chamber opening at a bottom side of the processing chamber, and the oven includes an elevator lift configured to lift the rack into the processing chamber through the chamber opening.

* * * * *